(12) United States Patent
Kuo et al.

(10) Patent No.: US 9,152,557 B2
(45) Date of Patent: *Oct. 6, 2015

(54) PROGRAM METHOD, DATA RECOVERY METHOD, AND FLASH MEMORY USING THE SAME

(71) Applicant: Macronix International Co., Ltd., Hsinchu (TW)

(72) Inventors: Lung-Yi Kuo, Jhubei (TW); Hsin-Yi Ho, Hsinchu (TW); Chun-Hsiung Hung, Hsinchu (TW); Shuo-Nan Hung, Jhubei (TW); Han-Sung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/265,400

(22) Filed: Apr. 30, 2014

(65) Prior Publication Data

US 2014/0281175 A1 Sep. 18, 2014

Related U.S. Application Data

(63) Continuation of application No. 13/086,988, filed on Apr. 14, 2011, now Pat. No. 8,738,844.

(51) Int. Cl.
| | |
|---|---|
| *G06F 3/06* | (2006.01) |
| *G06F 12/02* | (2006.01) |
| *G11C 16/10* | (2006.01) |
| *G11C 11/56* | (2006.01) |
| *G06F 11/00* | (2006.01) |

(52) U.S. Cl.
CPC ............ *G06F 12/0246* (2013.01); *G06F 11/00* (2013.01); *G11C 16/10* (2013.01); *G11C 16/105* (2013.01); *G06F 2212/7201* (2013.01); *G06F 2212/7203* (2013.01); *G11C 2211/5648* (2013.01)

(58) Field of Classification Search
CPC .................. G11C 11/5628; G11C 2211/5648; G11C 16/105; G11C 16/102; G06F 12/0244; G06F 2212/7203
See application file for complete search history.

(56) References Cited

U.S. PATENT DOCUMENTS

| | | | |
|---|---|---|---|
| 6,260,156 B1 * | 7/2001 | Garvin et al. | 714/6.13 |
| 7,594,157 B2 | 9/2009 | Choi et al. | |
| 2006/0259718 A1 | 11/2006 | Paley | |
| 2008/0162789 A1 * | 7/2008 | Choi et al. | 711/103 |
| 2009/0013139 A1 * | 1/2009 | Woo et al. | 711/162 |
| 2010/0074012 A1 | 3/2010 | Park et al. | |
| 2011/0216587 A1 | 9/2011 | Lee | |

* cited by examiner

*Primary Examiner* — Cheng-Yuan Tseng
*Assistant Examiner* — Rocio Del Mar Perez-Velez
(74) *Attorney, Agent, or Firm* — McClure, Qualey & Rodack, LLP

(57) ABSTRACT

A program method for a multi-level cell (MLC) flash memory is provided. The memory array includes a plurality of pages and a plurality of paired pages, which correspond to the respective pages. The program method includes the following steps. Firstly, a program address command is obtained. Next, whether the program address command corresponding to any one of the paired pages is determined. When the program address command corresponds to a first paired page, which corresponds to a first page among the pages, among the paired pages, data stored in the first page to a non-volatile memory are copied. After that, the first paired page is programmed.

13 Claims, 5 Drawing Sheets

|     | C_1  | C_2  | C_3  | ... | C_N-1  | C_N  |
|-----|------|------|------|-----|--------|------|
| P   | B1_1 | B1_2 | B1_3 | ... | B1_N-1 | B1_N |
| Pp  | B2_1 | B2_2 | B2_3 | ... | B2_N-1 | B2_N |

| P_1 |
| Pp_1 |
| P_2 |
| Pp_2 |
| ⋮ |
| P_M |
| Pp_M |

FIG. 3

PROGRAM METHOD, DATA RECOVERY METHOD, AND FLASH MEMORY USING THE SAME

This application is a continuation application of application Ser. No. 13/086,988, filed on Apr. 14, 2011, now U.S. patent No. 8,738,844. The contents of all the foregoing applications are incorporated herein by reference.

BACKGROUND OF THE INVENTION

1. Field of the Invention

The invention relates in general to a program method and a data recovery method, and more particularly to a program method and a data recovery method applied on a multi-level cell (MLC) flash memory.

2. Description of the Related Art

In the present age, non-volatile memory devices have become more popular for use in various electronic devices. For example, flash memory is one of the most popular non-volatile semiconductor memories applied in the present age. In detail, flash memory includes flash memory cells with programmable threshold voltages, so that each of the flash memory cells can be programmed to indicate at least one bit of data. In a case of multi-level cell (MLC) flash memory, each memory cells thereof can be programmed with more than two different levels, so that more than one bit of data, e.g. two bit of data, can be stored therein.

Generally, two program cycles have to be applied to each of the MLC cells, so that the two bit of data stored therein can be programmed with designated values. For MLC cells corresponding to a same block (i.e. a unit array for program operation), bits of data, stored therein, programmed in the same first program cycle are arranged as pages, while bits of data, stored therein, programmed in the same second program cycle are arranged as paired pages corresponding to the respective pages.

Conventionally, MLC flash memory suffers from data loss of the pages of the block if power off event strikes in the program cycle of the paired pages of the block. Thus, how to provide a decent program method and a decent data recovery method capable of preventing the data loss of the pages has become a prominent object for the industries.

SUMMARY OF THE INVENTION

The invention is directed to a program method and a data recovery method applied in a flash memory. The program method determines whether a program address command is corresponding to a paired page within the flash memory, and employs a non-volatile memory for copying data stored in a page corresponding to the paired page before programming the paired page. The data recovery method determines whether a program fail event has taken place in the paired page, and recovers data stored in the page within the copied data stored in the non-volatile memory, so that data recovery of the page can be achieved even program failure has taken place on the paired page. Thus, in comparison to conventional multi-level cell (MLC) memory access method, the program, data recovery methods, and the flash memory thereof directed by the invention are capable of preventing the data loss of the pages.

According to an aspect of the present invention, a program method for an MLC flash memory is provided. The memory array includes a plurality of pages and a plurality of paired pages, which correspond to the respective pages. The program method includes the following steps. Firstly, a program address command is obtained. Next, whether the program address command corresponding to any one of the paired pages is determined. When the program address command corresponds to a first paired page, which corresponds to a first page among the pages, among the paired pages, data stored in the first page to a non-volatile memory are copied. After that, the first paired page is programmed.

According to a second aspect of the invention, a data recovery method for an MLC flash memory is provided. The memory array includes a plurality of pages and a plurality of paired pages, which correspond to the respective pages. The data recovery method includes the following steps. Firstly, whether a program completed flag has been set to indicate a fair program operation is determined. When the program completed flag indicates that a program fail event has taken place in a marked paired page within a first block, data stored in pages, except the marked paired page and a marked page corresponding to the marked paired page, of the first block are moved to a clean second block. After the data have been moved, a reserved page within the clean second block with backup data, which are recorded in a non-volatile memory, of the marked page is programmed, so that data recovery of the marked page can be achieved even program failure has taken place on the marked paired page.

According to a third aspect of the invention, a flash memory is provided. The flash memory includes a memory controller and an MLC flash memory circuit. The memory controller provides a program address command. The MLC flash memory circuit includes a memory array, a non-volatile memory, and a controller. The memory array includes pages and paired pages, which correspond to the respective pages. The controller determines whether the program address command corresponding to any one of the paired pages. When the program address command corresponds to a first paired page, which corresponds to a first page among the pages, among the paired pages, the controller copies data stored in the first page to the non-volatile memory. The controller further programs the first paired page after the data stored in the page has been copied.

According to a fourth aspect of the invention, a flash memory is provided. The flash memory includes a non-volatile memory and an MLC flash memory circuit. The MLC flash memory circuit includes a memory array, wherein the memory array includes a plurality of pages and a plurality of paired pages, which correspond to the respective pages. The memory controller determines whether a program address command corresponding to any one of the paired pages. When the program address command corresponds to a first paired page, which corresponds to a first page among the pages, among the paired pages, the memory controller copies data stored in the first page to the non-volatile memory. The memory controller further programs the first paired page after the data stored in the page has been copied.

The invention will become apparent from the following detailed description of the preferred but non-limiting embodiments. The following description is made with reference to the accompanying drawings.

BRIEF DESCRIPTION OF THE DRAWINGS

FIG. 2 is an illustration for a page and a corresponding paired page of a memory block MB.

FIG. 3 is another illustration for pages and corresponding paired pages of a memory block MB'.

DETAILED DESCRIPTION OF THE INVENTION

First Embodiment

Figure 1:
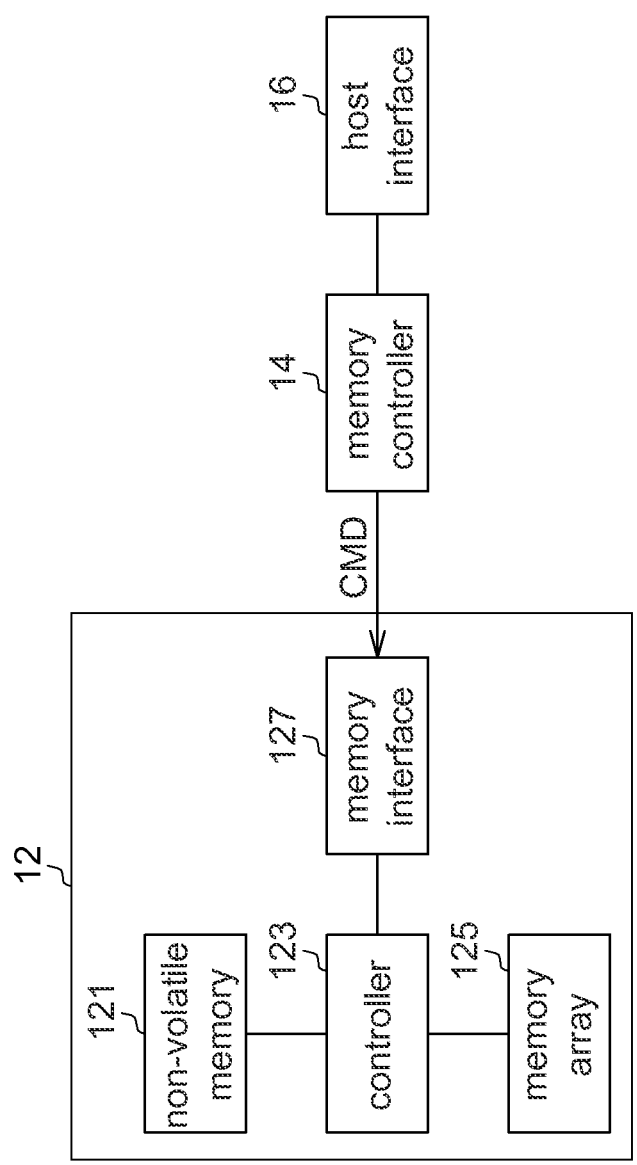
FIG. 1 is a block diagram of the flash memory according to a first embodiment of the invention.

Referring to FIG. 1, a block diagram of the flash memory according to the first embodiment of the invention is shown. The flash memory 1 includes a multi-level cell (MLC) flash memory circuit 12, a memory controller 14, and a host interface 16. The memory controller 14 is connected to a host (not shown) via the host interface 16 and provides a program address command CMD under the control of the host.

The MLC flash memory circuit 12 includes a non-volatile memory 121, a controller 123, a memory array 125, and a memory interface 127. The memory array 125 includes a number of MLC cells, each of which can be programmed with more than two different levels, so that more than one bit of data can be stored therein. In an example, each of the MLC cells is able to store two bits of data and two program cycles are accordingly needed to respectively have the two bit of data stored therein programmed with designated values. In other words, the number of bits that can be stored in the memory array 125 is substantially double than the number of MLC cells therein.

The data stored in the MLC cells are further arranged into a number of blocks, which are regarded as a unit array for program operation. For MLC cells corresponding to a same block, the first bits, i.e. the bits stored therein and programmed in a first program cycle, are clustered as at least a page, while the second bits, i.e. the bits stored therein and programmed in a second program cycle, are clustered as at least a paired page corresponding to the page. For example, a block MB is arranged into at least a page P and at least a paired page Pp, which are respectively programmed in the first and the second program cycles, as depicted in FIG. 2. N MLC cells C_1-C_N are employed for storing the N first bits B1_1-B1_N of the page P and the n second bits B2_1-B2_N of the paired page Pp.

In other example, the blocks of the memory array 125 are not limited as including only one page P and one paired page and may include more than one pages P_1-P_M and more than one paired pages Pp_1-Pp_M, while each of the pages P_1-P_M and the corresponding pair pages Pp_1-Pp_M have the same bits arrangement as that of the illustrated page P and the paired page Pp, as depicted in FIG. 3, wherein M is a natural number greater than 1.

The non-volatile memory 121 is, for example, a phase change memory, e.g. PCME, PRAM, PCRAM, Ovonic Unified Memory, Chalcogenide RAM and C-RAM. In an embodiment, the non-volatile memory 121 is a PCRAM memory.

Figure 4:
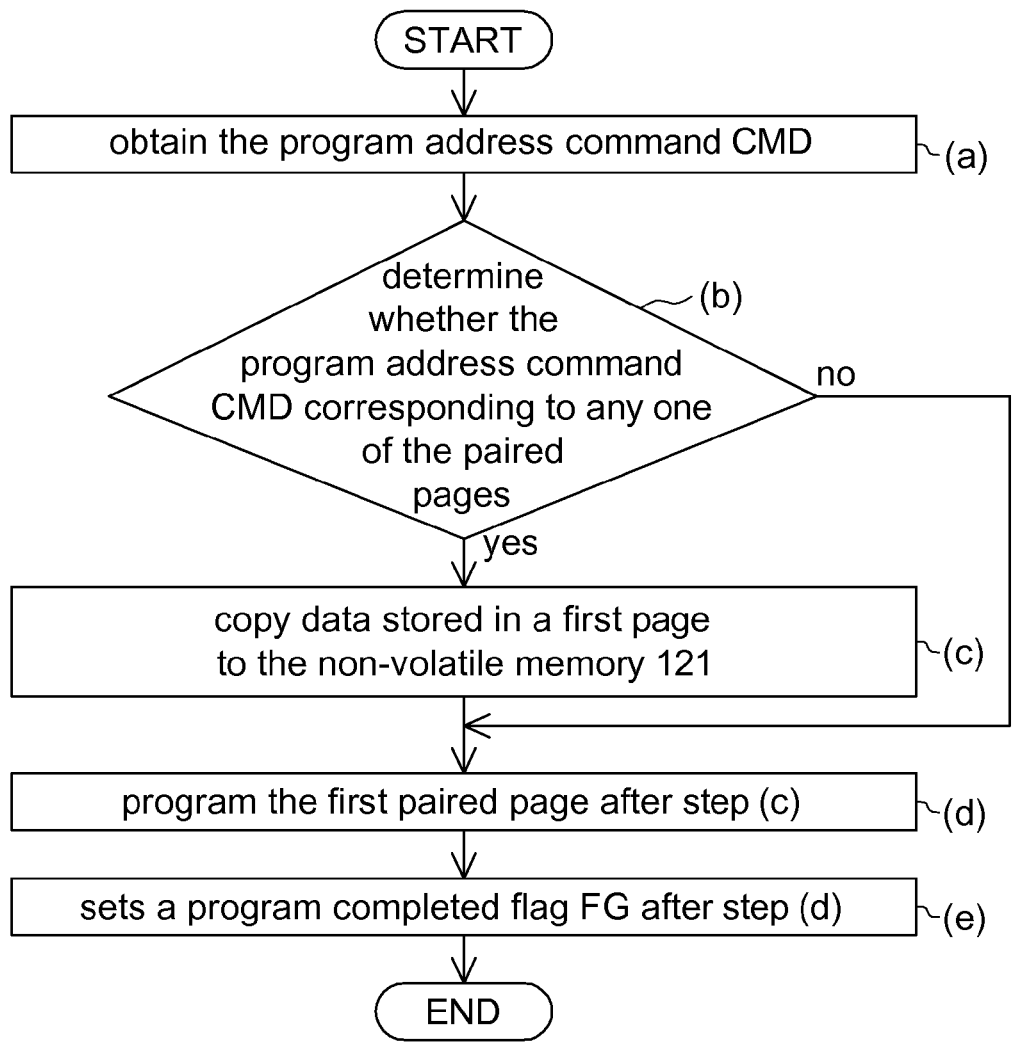
FIG. 4 is a flow chart of the program method according to the first embodiment of the invention.

The controller 123 is connected to the memory controller 14 via the memory interface 127. The controller 123 further executes a program method for accordingly have the memory array 125 programmed according to the program address command CMD. Referring to FIG. 4, a flow chart of the program method according to the first embodiment of the invention is shown. The program method includes the following steps.

As shown in step (a), the controller 123 firstly obtains the program address command CMD provided by the memory controller 14. As shown in step (b), the controller 123 then determines whether the program address command CMD corresponding to any one of the paired pages of the memory array 125, e.g. the paired pages Pp_1-Pp_M of the block MB'.

When the program address command CMD corresponds to a first paired page, e.g. a paired page Pp_i of the block MB', the program method proceeds to step (c), in which the controller 123 copies data stored in a first page, e.g. the page P_i corresponding to a paired page Pp_i, to the non-volatile memory 121, wherein i is a natural number smaller than or equal to M. As shown in step (d), the controller 123 then programs the first paired page after the data stored in the first page has been copied.

After step (b), when the program address command CMD corresponds to the first page, e.g. the page P_i, rather than any one of the paired pages of the memory array 125, the program method directly proceeds to step (d).

In an example, the program method further includes step (e), which is executed after step (d), in which the controller 123 sets a program completed flag FG after the first paired page has been programmed. For example, the program compete flag FG is a flag of the non-volatile memory 121 and the program complete flag FG indicates the first paired page has been programmed completely or not.

Based on the above description, the program method executed by the controller 123 can have the data stored in the first page copied before the program operation of the corresponding first paired page. Thus, even power failure strikes when the first paired page is programmed, the data stored in the first page, i.e. the data stored in the same MLC cells as the first paired page, will be keep in the non-volatile memory 121, so as to avoid the unwanted data loss situation.

Figure 5:
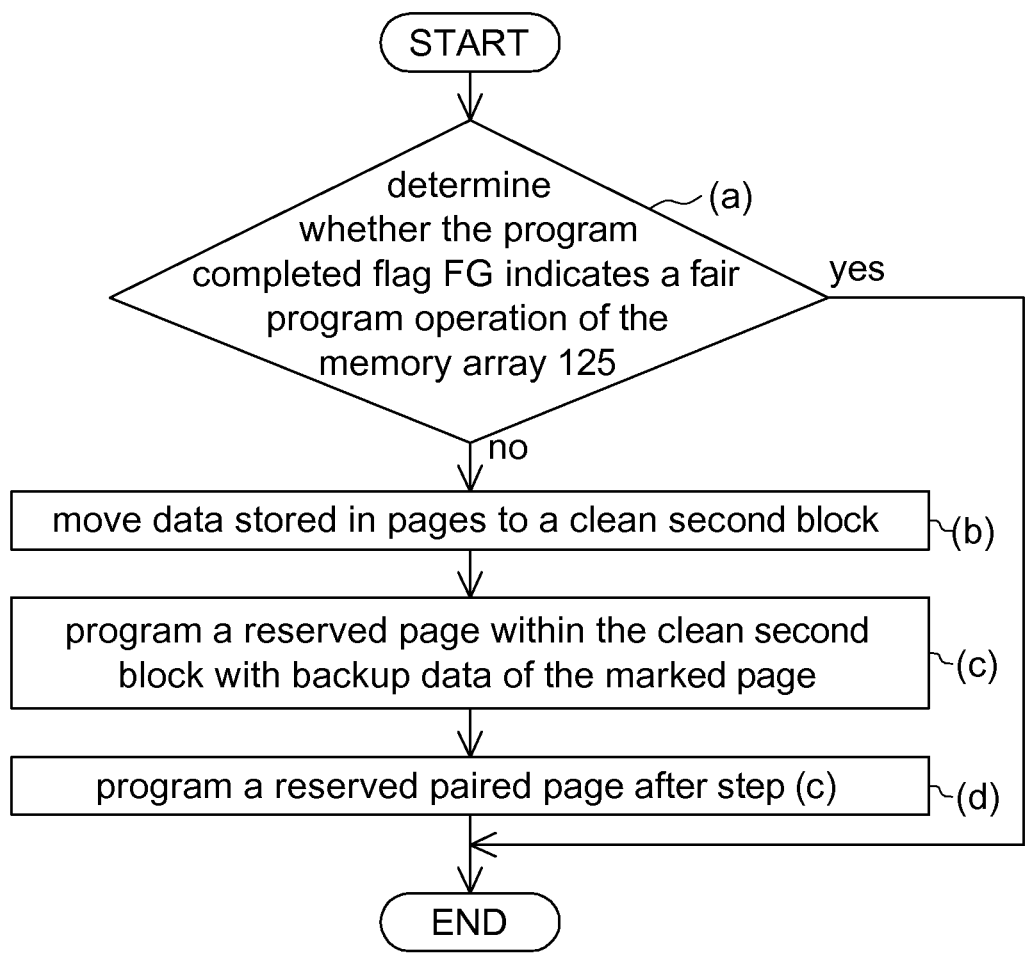
FIG. 5 is a flow chart of the program method according to the first embodiment of the invention.

The controller 123 further executes a data recovery method for accordingly have lost data, if any, of the memory array 125 recovered according to the data copied in the non-volatile memory 121. Referring to FIG. 5, a flow chart of the program method according to the first embodiment of the invention is shown. The data recovery method includes the following steps. As shown in step (a), the controller 123 firstly determines whether the program completed flag FG has been set to indicate a fair program operation of the memory array 125; if so, the data recovery method accordingly ends.

When the program completed flag FG indicates that a program fail event has taken place in a marked paired page of a first block, e.g. the paired page Pp_i, the data recovery method proceeds to step (b), in which the controller 123 moves data stored in pages, except the marked paired page and a marked page, e.g. the page P_i, corresponding to the marked paired page of the first block to a clean second block. For example, the clean second block is an empty block of the memory array 125.

After step (b), the data recovery method proceeds to step (c), in which the controller 123 programs a reserved page within the clean second block with backup data, which are recorded in the non-volatile memory 121, of the marked page, so that data recovery of the marked page can be achieved even program failure has taken place on the marked paired page. After step (c), the data recovery method proceeds to step (d), in which the controller 123 programs a reserved paired page, corresponding to the reserved page, within the clean second block after the reserved page has been programmed.

Based on the above description, the data recovery method executed by the controller 123 can have the data stored in the marked page recovered with the copied data stored in the non-volatile memory 121. Thus, even power failure strikes when the marked paired page is programmed, the data stored in the marked page, i.e. the data stored in the same MLC cells as the marked paired page, can be recovered by the copied data stored the non-volatile memory 121, so as to avoid the unwanted data loss situation.

Second Embodiment

Figure 6:
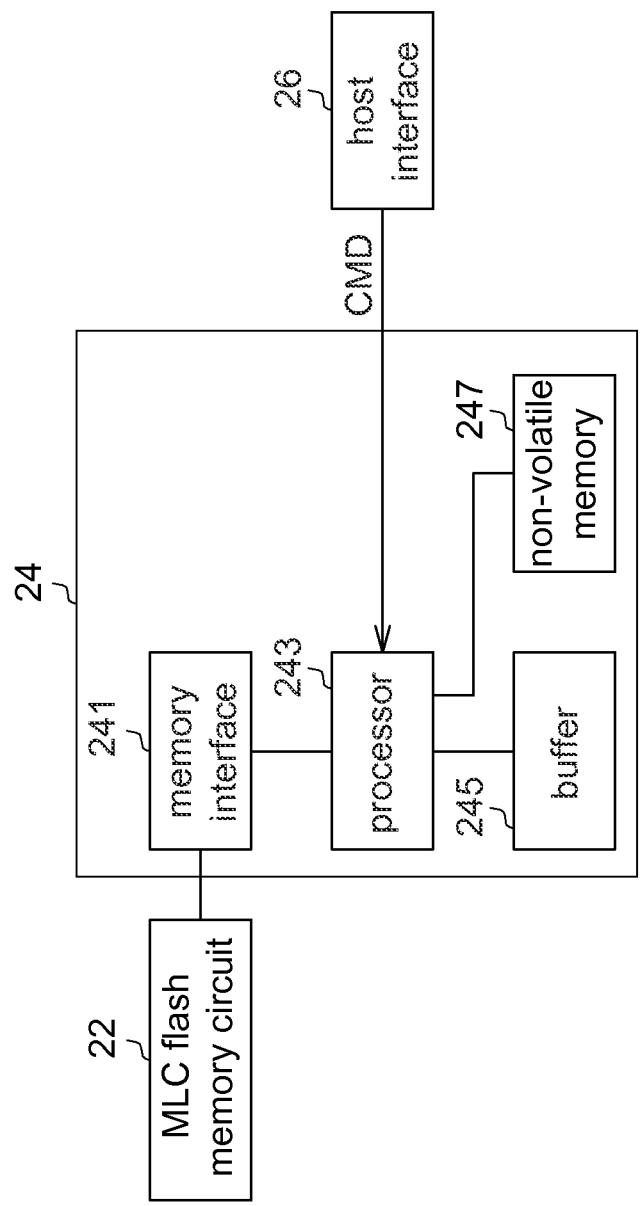
FIG. 6 is a block diagram of the flash memory according to a second embodiment of the invention.

Referring to FIG. 6, a block diagram of the flash memory according to the second embodiment of the invention is shown. The flash memory 2 according to the second embodiment is different from the flash memory 1 according to the first embodiment in that the non-volatile memory 247 is provided in the memory controller 24, rather than in the MLC flash memory circuit 22. Thus, the operation of the controller 123 disclosed in the first embodiment is now executed by a processor 243 of the memory controller 24.

The program method according to the above mentioned embodiments determines whether a program address command is corresponding to a paired page within the flash memory, and employs a non-volatile memory for copying data stored in a page corresponding to the paired page before programming the paired page. The data recovery method according to the above mentioned embodiments determines whether a program fail event has taken place in the paired page, and recovers data stored in the page within the copied data stored in the non-volatile memory, so that data recovery of the page can be achieved even program failure has taken place on the paired page. Thus, in comparison to conventional multi-level cell (MLC) memory access method, the program, data recovery methods, and the flash memory thereof according to the above mentioned embodiments are capable of preventing the data loss of the pages.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A program method for a non-volatile memory, the non-volatile memory comprising a memory array, the memory array comprising a plurality of first data units and a plurality of second data units for storing data bits, which respectively correspond to the first data units, the program method comprising:
   obtaining a program address command;
   determining whether the program address command corresponds to any one of the second data units;
   when the program address command corresponds to a target second data unit, which corresponds to a target first data unit among the first data units, among the second data unit, copying data stored in the target first data unit to a storage unit; and
   programming the target second data unit after the data stored in the target first data unit has been copied;
   wherein when a program fail event has taken place in a marked second data unit of the memory array, moving data stored in first data units, except the marked second data unit and a marked first data unit corresponding to the marked second data unit, to a clean memory block.

2. The program method according to claim 1, further comprising:
   when the program address command corresponds to another target first data unit among the first data units, directly programming the another target first data unit.

3. The program method according to claim 1, further comprising:
   setting a program completed flag after the target second data unit has been programmed.

4. A non-volatile memory, comprising:
   a memory controller, for providing a program address command; and
   a memory circuit, comprising:
   a memory array, comprising a plurality of first data units and a plurality of second data units for storing data bits, which respectively correspond to the first data units;
   a storage unit; and
   a controller, determining whether the program address command corresponds to any one of the second data units, when the program address command corresponds to a target second data unit, which corresponds to a target first data unit among the first data units, among the second data units, the controller copying data stored in the target first data unit to the storage unit, wherein,
   the controller further programs the target second data unit after the data stored in the first data unit has been copied, and when a program fail event has taken place in a marked second data unit of the memory array, data stored in the first data units, except the marked second data unit and a marked first data unit corresponding to the marked second data unit, are moved to a clean memory block.

5. The non-volatile memory according to claim 4, wherein when the program address command corresponds to another target first data unit among the first data units, the controller directly programs the another target first data unit.

6. The non-volatile memory according to claim 4, wherein the non-volatile memory further comprises:
   a program completed flag, the controller setting the program completed flag after the target second data unit has been programmed.

7. The non-volatile memory according to claim 6, wherein the controller further determines whether the program completed flag has been set to indicate a fair program operation, wherein, when the program completed flag indicates that a program fail event has taken place in a marked second data unit, the controller moves data stored in the first data units, except the marked second data unit and a marked first data unit corresponding to the marked second data unit, to a clean memory block.

8. The non-volatile memory according to claim 7, wherein after the data have been moved, the controller programs a reserved first data unit within the clean memory block with the data copied and stored in the storage unit, of the marked first data unit, so that data recovery of the marked first data unit can be achieved even program failure has taken place on the marked second data unit.

9. A non-volatile memory, comprising:
   a storage unit;
   a memory circuit, comprising:
   a memory array, wherein the memory array comprises a plurality of first data units and a plurality of second data units for storing data bits, which respectively correspond to the first data units; and
   a memory controller, for determining whether a program address command corresponds to any one of the second data units, when the program address command corresponds to a target second data unit, which corresponds to a target first data unit among the first data units, among the second data units, the memory controller copying data stored in the target first data unit to the storage unit, wherein,
   the memory controller further programs the target second data unit after the data stored in the first data unit has been copied, and when a program fail event has taken place in a marked second data unit of the memory array, data stored in the first data units, except the marked second data unit and a marked first data unit corresponding to the marked second data unit, are moved to a clean memory block.

10. The non-volatile memory according to claim 9, wherein when the program address command corresponds to another target first data unit among the first data units, the controller directly programs the another target first data unit.

11. The non-volatile memory according to claim 10, wherein the storage unit further comprises:
   a program completed flag, the memory controller setting the program completed flag after the target second data unit has been programmed.

12. The non-volatile memory according to claim 11, wherein the memory controller further determines whether the program completed flag has been set to indicate a fair program operation,
   wherein, when the program completed flag indicates that a program fail event has taken place in a marked second data unit, the memory controller moves data stored in the first data units, except the marked second data unit and a marked first data unit corresponding to the marked second data unit, to a clean memory block.

13. The non-volatile memory according to claim 12, wherein after the data have been moved, the memory controller programs a reserved first data unit within the clean memory block with the data copied and stored in the storage unit, of the marked first data unit, so that data recovery of the marked first data unit can be achieved even program failure has taken place on the marked second data unit.

* * * * *